US011652046B2

(12) United States Patent
Urakawa

(10) Patent No.: US 11,652,046 B2
(45) Date of Patent: May 16, 2023

(54) SEMICONDUCTOR INTEGRATED CIRCUIT DEVICE AND OSCILLATION CIRCUIT APPARATUS

(71) Applicant: KIOXIA CORPORATION, Tokyo (JP)

(72) Inventor: Go Urakawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 154 days.

(21) Appl. No.: 17/006,698

(22) Filed: Aug. 28, 2020

(65) Prior Publication Data

US 2021/0287987 A1 Sep. 16, 2021

(30) Foreign Application Priority Data

Mar. 16, 2020 (JP) .............................. JP2020-045705

(51) Int. Cl.
*H01L 23/52* (2006.01)
*H01L 23/522* (2006.01)
*H03B 5/12* (2006.01)
*H01L 49/02* (2006.01)

(52) U.S. Cl.
CPC .......... *H01L 23/5227* (2013.01); *H01L 28/10* (2013.01); *H03B 5/1212* (2013.01); *H03B 5/1228* (2013.01)

(58) Field of Classification Search
CPC ... H01L 23/5227; H01L 28/10; H03B 5/1212; H03B 5/1228; H03B 5/124; H03B 5/12
See application file for complete search history.

(56) References Cited

U.S. PATENT DOCUMENTS

| 6,281,778 | B1* | 8/2001 | El-Sharawy | H01L 27/08 336/200 |
| 6,927,664 | B2 | 8/2005 | Nakatani et al. | |
| 2004/0227608 | A1* | 11/2004 | Nakatani | H01P 5/10 336/173 |
| 2005/0046501 | A1* | 3/2005 | Moore | H03B 5/1253 331/117 FE |
| 2006/0220773 | A1* | 10/2006 | Su | H01L 23/5227 336/200 |

(Continued)

FOREIGN PATENT DOCUMENTS

| CN | 1905361 A | 1/2007 |
| JP | 2012222252 A | 11/2012 |

(Continued)

*Primary Examiner* — S M Sohel Imtiaz
(74) *Attorney, Agent, or Firm* — Kim & Stewart LLP

(57) ABSTRACT

According to one or more embodiments, a semiconductor integrated circuit device includes a first inductor portion, a second inductor portion, and a third inductor portion. The first inductor portion is in a first region of a first wiring layer. The second inductor portion is disposed in a second region of the first wiring layer. The third inductor portion is on a second wiring layer spaced from the first wiring layer in a first direction. The third inductor portion includes a first end portion electrically connected to a first end of the first inductor portion, a second end portion electrically connected to a first end of the second inductor portion, and a third end portion between the first and second end portions. The first inductor portion, the second inductor portion, and the third inductor portion constitute an inductor element.

20 Claims, 9 Drawing Sheets

(56) References Cited

U.S. PATENT DOCUMENTS

| | | | |
|---|---|---|---|
| 2011/0248809 A1* | 10/2011 | Gertenbach | H01F 27/346 336/173 |
| 2012/0244802 A1* | 9/2012 | Feng | H04B 5/0087 336/225 |
| 2015/0206634 A1* | 7/2015 | Yan | H01F 17/0006 336/182 |
| 2017/0179881 A1* | 6/2017 | Caffee | H03B 5/08 |
| 2017/0359097 A1* | 12/2017 | Uchida | H01L 23/552 |
| 2019/0252110 A1* | 8/2019 | Yen | H01F 27/29 |

FOREIGN PATENT DOCUMENTS

| | | | |
|---|---|---|---|
| JP | 5177387 B2 | 4/2013 | |
| TW | 200507442 A | 2/2005 | |

\* cited by examiner

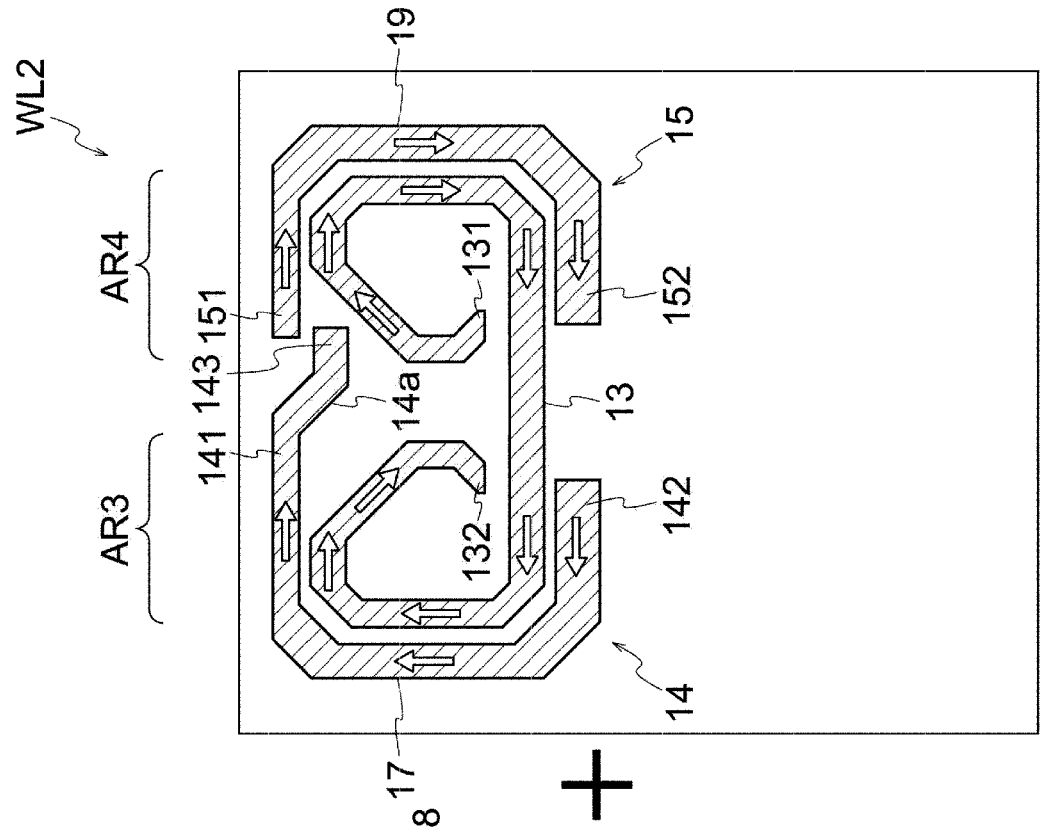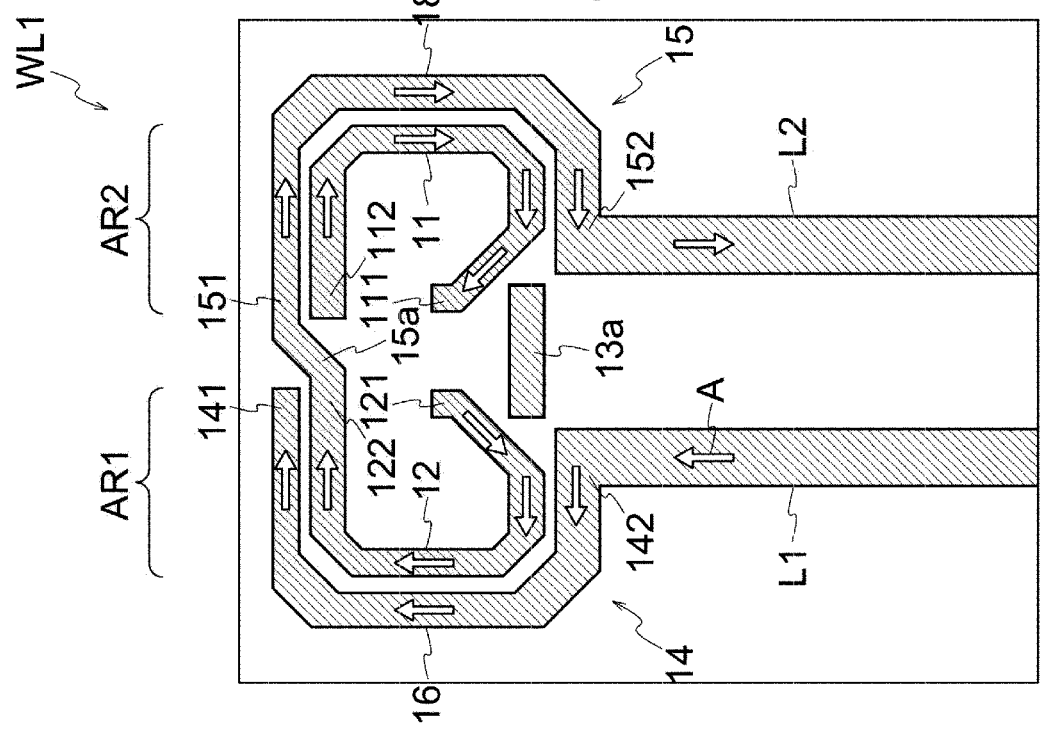

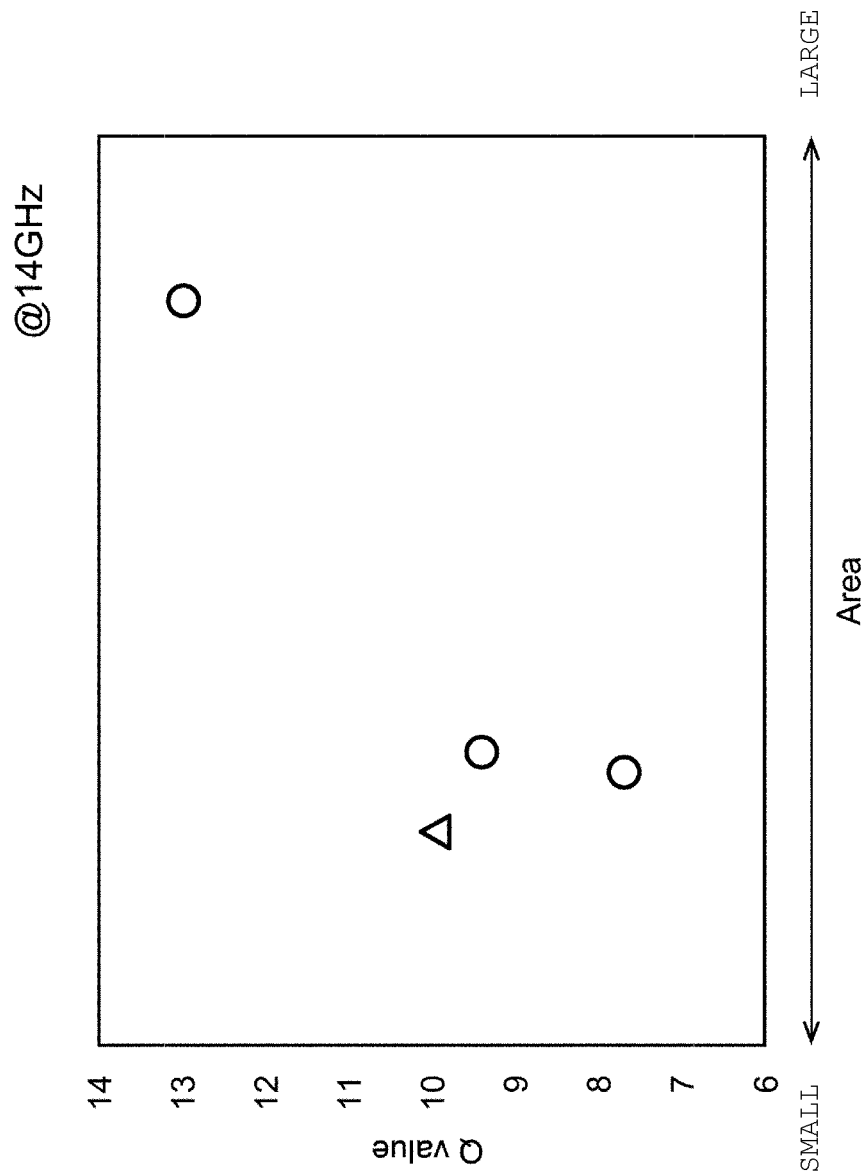

SEMICONDUCTOR INTEGRATED CIRCUIT DEVICE AND OSCILLATION CIRCUIT APPARATUS

CROSS-REFERENCE TO RELATED APPLICATION

This application is based upon and claims the benefit of priority from Japanese Patent Application No. 2020-045705, filed Mar. 16, 2020, the entire contents of which are incorporated herein by reference.

FIELD

Embodiments described herein relate generally to a semiconductor integrated circuit device and an oscillation circuit apparatus.

BACKGROUND

As an oscillation circuit, for example, an LC oscillation circuit using LC resonance or a ring-shaped oscillation circuit using an inversion circuit is employed in some cases. As compared with the ring-shaped oscillation circuit, the LC oscillation circuit is known for having a lower phase noise characteristics and consuming less power in a high frequency band.

In an LC oscillation circuit inclusion of an inductor generally occupies such a large area that the overall area occupied by the circuit may necessarily be increased.

BRIEF DESCRIPTION OF THE DRAWINGS

FIGS. 9A and 9B each depicts the inductor element in FIG. 8 in an exploded level state in a plan view according to the second embodiment.

FIG. 10 depicts an example relation between a Q value and an occupation area according to the second embodiment.

DETAILED DESCRIPTION

Figure 1:
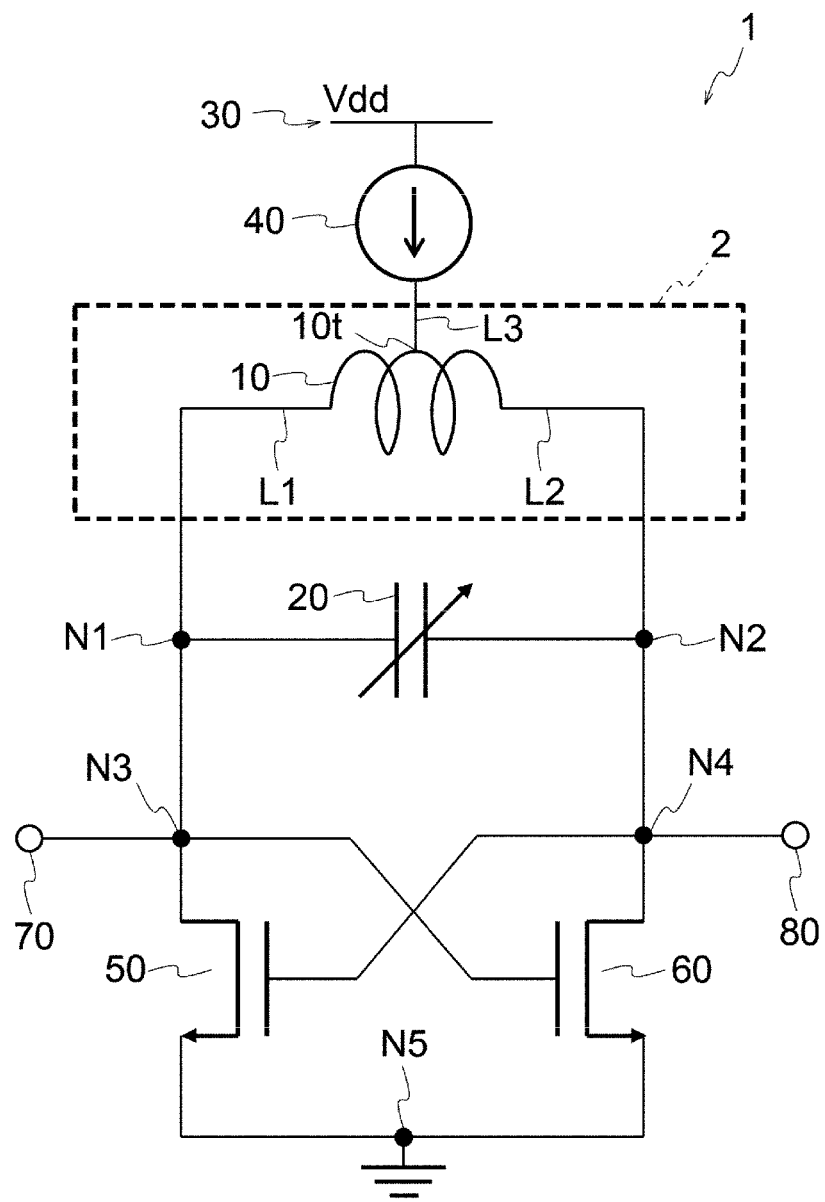
FIG. 1 is a circuit diagram of an oscillation circuit apparatus according to a first embodiment.

Embodiments provide a semiconductor integrated circuit device and an oscillation circuit apparatus that can be reduced in size.

According to one or more embodiments, a semiconductor integrated circuit device includes an inductor element including a first inductor portion, a second inductor portion, and a third inductor portion. The first inductor portion is in a first region on a first wiring layer. The second inductor portion is in a second region on the first wiring layer. The second region is adjacent to the first region. The third inductor portion is on a second wiring layer spaced from the first wiring layer in a first direction. The third inductor portion includes a first end portion electrically connected to a first end of the first inductor portion, a second end portion electrically connected to a first end of the second inductor portion, and a third end portion between the first and second end portions.

Hereinafter, example embodiments of the present disclosure will be described with reference to the drawings. These embodiments do not limit the present disclosure. In the following embodiments, a vertical direction refers to a relative direction from a surface of the semiconductor substrate on which various semiconductor elements are disposed. The surface may be said to face upward, but this vertical direction may differ from a vertical direction relative to gravitational acceleration in some cases. The drawings are schematic or conceptual diagrams, and sizes and dimensional ratios of aspects are not necessarily the same as actual values. In the specification and the drawings, the components substantially the same as those already described with reference to a preceding drawing(s) are denoted with the same reference numerals and signs and will not be repeatedly explained for each subsequent drawing.

First Embodiment

FIG. 1 is a circuit diagram illustrating a configuration of an oscillation circuit apparatus 1 according to the first embodiment. The oscillation circuit apparatus 1 generates a signal at a frequency determined by LC resonance.

The oscillation circuit apparatus 1 includes a semiconductor integrated circuit device 2, a capacitor 20, a power source connector 30, a current source 40, a semiconductor switch 50, a semiconductor switch 60, an output terminal 70, and an output terminal 80. The oscillation circuit apparatus 1 is formed as a differential circuit with bilateral symmetry. The semiconductor integrated circuit device 2 includes an inductor element 10 and an end portion 10t.

The semiconductor integrated circuit device 2 is formed on a substrate where multiple wiring layers are disposed. Examples of the substrate include a semiconductor substrate. The multiple wiring layers may be wiring layers including interlayer insulating films.

The inductor element 10 along with the capacitor 20 constitutes part of an LC oscillation circuit. The inductor element 10 has one end connected to a node N1 via wiring L1 and has the other end connected to a node N2 via wiring L2.

When current or voltage is applied, the end portion 10t supplies power to the inductor element 10. The end portion 10t is connected to wiring L3. The end portion 10t is, for example, a terminal such as a center tap. The inductor element 10 may include the end portion 10t.

The inductor element 10 and the end portion 10t will be described in further detail later with reference to FIGS. 2, 3, 4A, and 4B.

The capacitor 20 has one end electrically connected to the first end of the inductor element 10 and has the other end electrically connected to the second end of the inductor element 10. The one end of the capacitor 20 is connected to the node N1 and the other end thereof is connected to the node N2. Capacitance of the capacitor 20 is variable.

The power source connector 30 as the power supply unit supplies power from a power source to the inductor element 10 via the end portion 10t. The power source connector 30 applies a voltage Vdd, for example.

The current source 40 is interposed between the power source connector 30 and the end portion 10t. The current source 40 is a constant current source, for example.

The semiconductor switch 50 is, for example, a transistor such as a field effect transistor (FET). The semiconductor switch 50 includes a gate connected to a node N4, a drain connected to a node N3, and a source connected to a node N5. The node N3 is connected to the node N1, and the node N4 is connected to the node N2. The node N5 is connected to wiring to have ground potential.

The semiconductor switch 60 is, for example, a transistor such as an FET. The semiconductor switch 60 includes a gate connected to the node N3, a drain connected to the node N4, and a source connected to the node N5.

The output terminal 70 is connected to the drain of the semiconductor switch 50 and the gate of the semiconductor switch 60. The output terminal 70 is connected to the node N3. The output terminal 70 is, for example, a signal output terminal of the oscillation circuit apparatus 1.

The output terminal 80 is connected to the drain of the semiconductor switch 60 and the gate of the semiconductor switch 50. The output terminal 80 is connected to the node N4. The output terminal 80 is, for example, a signal output terminal of the oscillation circuit apparatus 1.

The output terminal 70 and the output terminal 80 output antiphase signals (differential signals).

Figure 2:
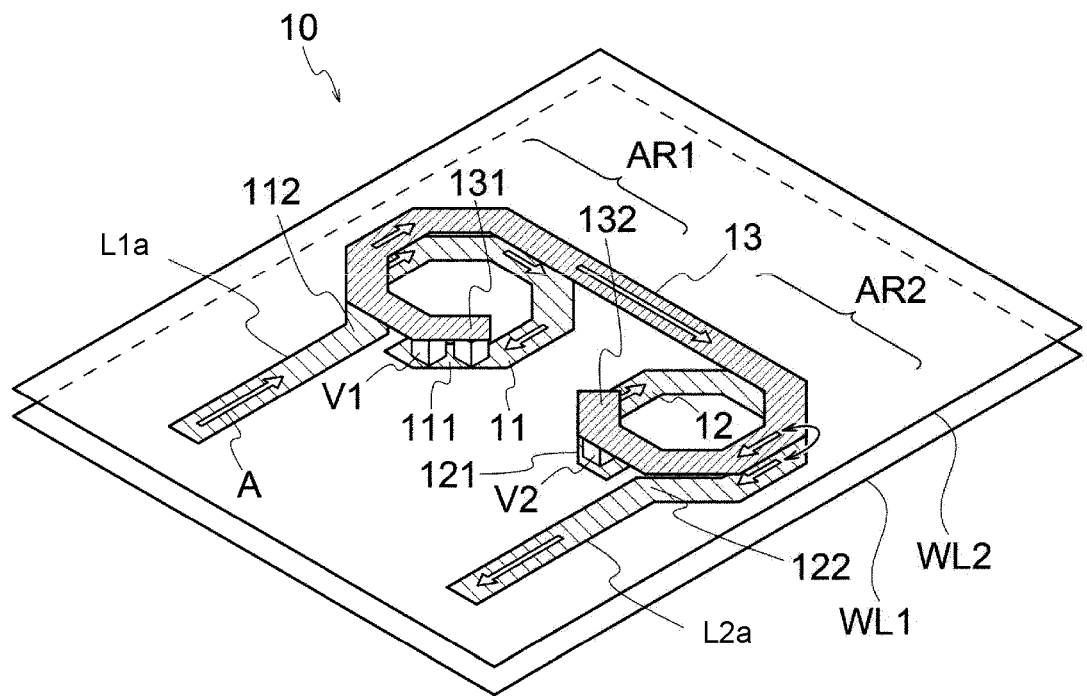
FIG. 2 depicts an inductor element in a perspective view according to the first embodiment.

FIG. 2 is a perspective view of the inductor element 10 according to the first embodiment, illustrating a configuration thereof. Note, illustration of the end portion 10t is omitted from FIG. 2. Arrows A indicate examples of current flowing directions.

The semiconductor integrated circuit device 2 of the oscillation circuit apparatus 1 is formed on the substrate where the plurality of wiring layers are disposed. That is, the semiconductor integrated circuit device 2 of the oscillation circuit apparatus 1 further includes the substrate.

The inductor element 10 includes an inductor portion 11, an inductor portion 12, an inductor portion 13, a via V1, and a via V2.

The inductor portion 11 is disposed in a region AR1 on a wiring layer WL1. The inductor portion 11 is, for example, a single-layer winding coil (also referred to as a one-turn coil or single turn coil) partly formed of polygonal shaped or annular shaped wiring. The inductor portion 11 has a first end 111 and a second end 112. In an example illustrated in FIG. 2, the first end 111 of the inductor portion 11 is connected to the via V1, and the second end 112 of the inductor portion 11 is connected to the wiring L1a (which is electrically connected to wiring L1 shown in FIGS. 3 and 4B). The inductor portion 11 is made of a conductive material, such as copper, aluminum, cobalt, and ruthenium.

The inductor portion 12 is disposed in a region AR2 on the wiring layer WL1. The region AR2 is not overlapping with the region AR1. The inductor portion 12 is, for example, a single-layer winding coil partly formed of polygonal shaped or annular shaped wiring. The inductor portion 12 has a first end 121 and a second end 122. In the example illustrated in FIG. 2, the first end 121 of the inductor portion 12 is connected to the via V2, and the second end 122 of the inductor portion 12 is connected to the wiring L2a (which is electrically connected to wiring L2 shown in FIGS. 3 and 4B). The inductor portion 12 may be made of, for example, the same material as the inductor portion 11.

The inductor portion 13 is disposed over a region AR3 and a region AR4 on a wiring layer WL2 (see FIG. 4B). The wiring layer WL2 is provided spaced from the wiring layer WL1 in a stacking direction. The region AR3 is a region on the wiring layer WL2 that overlaps the region AR1 on the wiring layer WL1 when viewed from the stacking direction. The region AR4 is a region on the wiring layer WL2 that overlaps the region AR2 on the wiring layer WL1 when viewed from the stacking direction. The region AR3 and the region AR4 are illustrated in FIG. 4B. The inductor portion 13 along with the inductor portion 11 and the inductor portion 12 forms the single inductor element 10. The inductor portion 13 includes an end portion 131 electrically connected to the first end 111 of the inductor portion 11, and an end portion 132 electrically connected to the first end 121 of the inductor portion 12. In the example illustrated in FIG. 2, the end portion 131 is connected to the via V1, and the end portion 132 is connected to the via V2. The inductor portion 13 may be made of, for example, the same material as the inductor portions 11 and 12. The inductor portions 11 to 13 are, for example, wiring formed on the substrate.

The part of the inductor portion 13 in the region AR3 on the wiring layer WL2 overlaps a part of the inductor portion 11 in the region AR1 when viewed from the stacking direction. The part of the inductor portion 13 that overlaps the inductor portion 11 has a partially polygonal shape or annular shape, for example. The part of the inductor portion 13 in the region AR3 on the wiring layer WL2 is magnetically coupled to the inductor portion 11. In the overlapping parts of the inductor portion 11 and the inductor portion 13, current flows in substantially the same direction, and the overlapping parts of the inductor portion 11 and the inductor portion 13 can increase inductance due to mutual inductance. The overlapping parts of the inductor portion 11 and the inductor portion 13 are coupled to mutually strengthen magnetic flux. The overlapping part of the inductor portion 13 essentially extends the inductor portion 11 in the stacking direction and increases the number of windings. Thus, even with a less line length, the inductance can be increased, and a Q value can be increased. The Q value is a parameter indicative of antenna performance or quality of the inductor element 10.

Another part of the inductor portion 13 in the region AR4 (see FIG. 4B) on the wiring layer WL2 overlaps apart of the inductor portion 12 in the region AR2 when viewed from the stacking direction. The part of the inductor portion 13 that overlaps the inductor portion 12 has a partially polygonal shape or annular shape, for example. The part of the inductor portion 13 in the region AR4 on the wiring layer WL2 is magnetically coupled to the inductor portion 12. In the overlapping parts of the inductor portion 12 and the inductor portion 13, current flows in substantially the same direction, and the overlapping parts of the inductor portion 12 and the inductor portion 13 can increase inductance due to mutual inductance. As illustrated in FIG. 2, the overlapping part of the inductor portion 13 essentially extends the inductor portion 12 in the stacking direction and increases the number of windings. Thus, even with a less line length, the inductance can be increased, and the Q value can be increased.

The via V1 extends in the stacking direction. The via V1 electrically connects the end portion 131 of the inductor portion 13 and the first end 111 of the inductor portion 11 to each other. Consequently, the via V1 connects the inductor portion 11 and the inductor portion 13 which are respectively disposed on the different wiring layers WL1 and WL2. In the example illustrated in FIG. 2, the via V1 includes a plurality of vias (e.g., two vias). However, the number of the vias V1 is not limited to this. For example, as overlapping distance of the inductor portion 11 and the inductor portion 13 becomes longer and more vias V1 can be provided, resistance value caused by the vias V1 can be further reduced by inclusion of additional vias V1. The vias V1 are made of, for example, a conductive material, such as tungsten and cobalt.

The via V2 extends in the stacking direction. The via V2 electrically connects the end portion 132 of the inductor portion 13 and the first end 121 of the inductor portion 12 to each other. Consequently, the via V2 connects the inductor portion 12 and the inductor portion 13 which are respectively disposed on the different wiring layers WL1 and WL2. In general, the number of the vias V2 may be the same as that of the vias V1. The vias V2 may be made of, for example, the same material as the vias V1.

Figure 3:
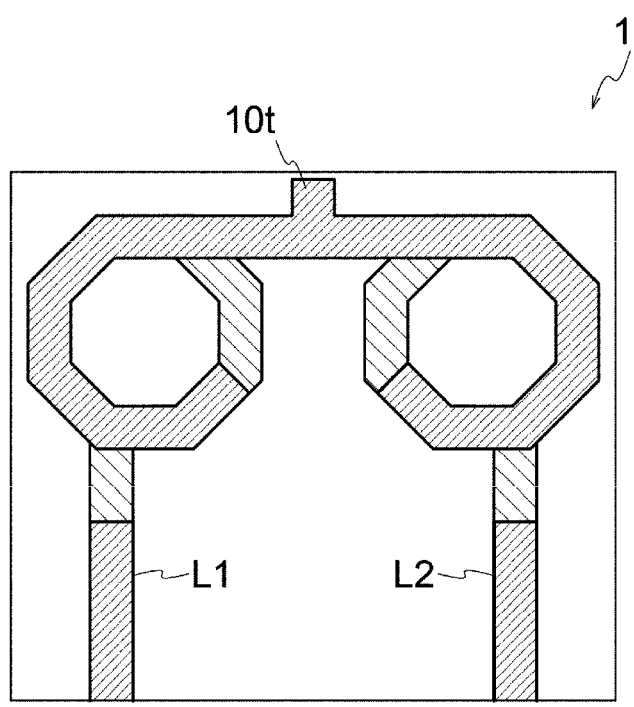
FIG. 3 depicts an inductor element in a plan view according to the first embodiment.
Figure 4:
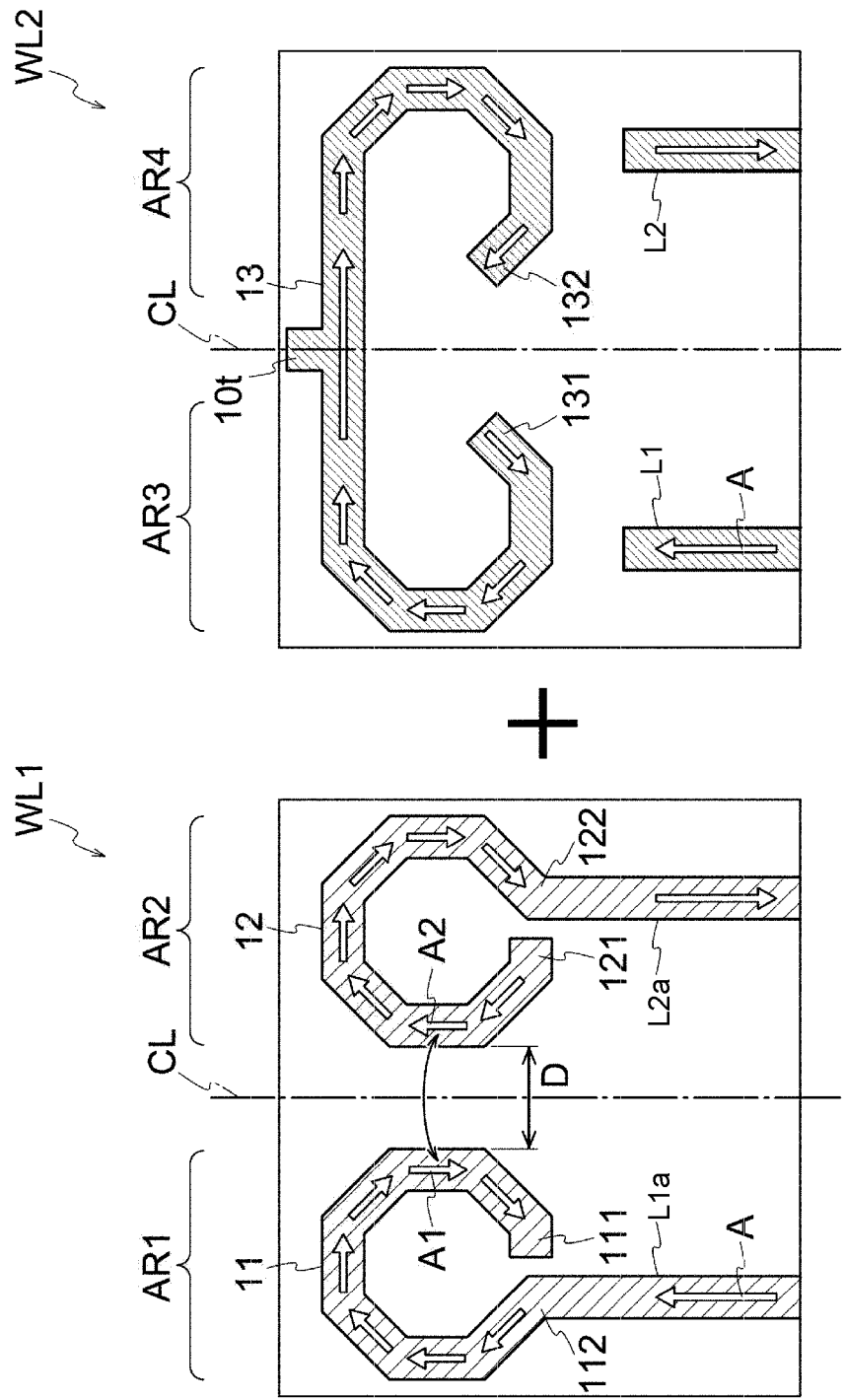
FIGS. 4A and 4B each depicts the inductor element in FIG. 3 in an exploded level state in a plan view according to the first embodiment.

FIG. 3 is a plan view of the inductor element 10 according to the first embodiment, illustrating a configuration thereof.

As illustrated in FIG. 3, as viewed from the stacking direction, part of the inductor portion 11 and part of the inductor portion 13 overlap each other to form a winding, and likewise part of the inductor portion 12 and part of the inductor portion 13 overlap each other to form a winding.

FIGS. 4A and 4B are plan views of the inductor element 10 in FIG. 3 in an exploded state depicting the different wiring levels. FIG. 4A illustrates the inductor portions 11 and 12 disposed on the wiring layer WL1. FIG. 4B illustrates the inductor portion 13 disposed on the wiring layer WL2. It is noted that the wiring L1 and L2 illustrated in FIG. 4B can be connected to wiring Lia and L2a illustrated in FIG. 4A with components such as vias.

The first end of the inductor element 10 that is connected to the wiring Lia and L1 corresponds to the second end 112 of the inductor portion 11, and the second end of the inductor element 10 that is connected to the wiring L2a and L2 corresponds to the second end 122 of the inductor portion 12.

In an example illustrated in FIGS. 4A and 4B, as indicated with the arrows A, resonance current flows in the sequence: through the wiring Lia (L1), the second end 112 of the inductor portion 11, the first end 111 of the inductor portion 11, the end portion 131 of the inductor portion 13, the end portion 132 of the inductor portion 13, the first end 121 of the inductor portion 12, the second end 122 of the inductor portion 12, and then the wiring L2a (L2).

As illustrated in FIG. 4A, the inductor portion 11 and the inductor portion 12 are mutually symmetrical with respect to a centerline CL midway between the inductor portion 11 and the inductor portion 12 as viewed from the stacking direction. That is, the inductor portion 11 and the inductor portion 12 have shapes in bilateral symmetry (i.e., reflection symmetry or line symmetry with respect to the centerline CL) with respect to one another. Here, it is noted that the centerline CL is a vertical line.

As illustrated in FIG. 4B, the inductor portion 13 is substantially symmetrical with respect to the centerline CL as viewed from the stacking direction. That is, the inductor portion 13 has a shape substantially in bilateral symmetry with respect to its portions in the regions AR3 and AR4.

As illustrated in FIG. 4B, the end portion 10t is disposed at a position on the inductor portion 13. For example, the end portion 10t is on the centerline CL on the inductor portion 13. Thus, with higher symmetry of the inductor element 10, symmetry of differential signal waveforms can be reliably obtained, and common mode noise generated by delay and asymmetry of the waveforms can be reduced.

As indicated with arrows A1 and A2 in FIG. 4A, at a position where the inductor portion 11 and the inductor portion 12 are in closest proximity to each other, the direction of current flowing through the inductor portion 11 is reverse to the direction of current flowing through the inductor portion 12. Consequently, between the inductor portion 11 and the inductor portion 12, a magnetic field generated by the inductor portion 11 and a magnetic field generated by the inductor portion 12 weaken each other. Thus, as a clearance D between the inductor portion 11 and the inductor portion 12 increases, the inductance of the inductor element 10 increases, and the Q value is increased. However, as the clearance D increases, an occupation area of the inductor element 10 is enlarged. That is, the inductor element 10 takes up more die area or the like. Therefore, the clearance D can be set within such a range as to satisfy required performances of the inductor element 10 while minimizing occupation area to the extent possible.

Figure 5:
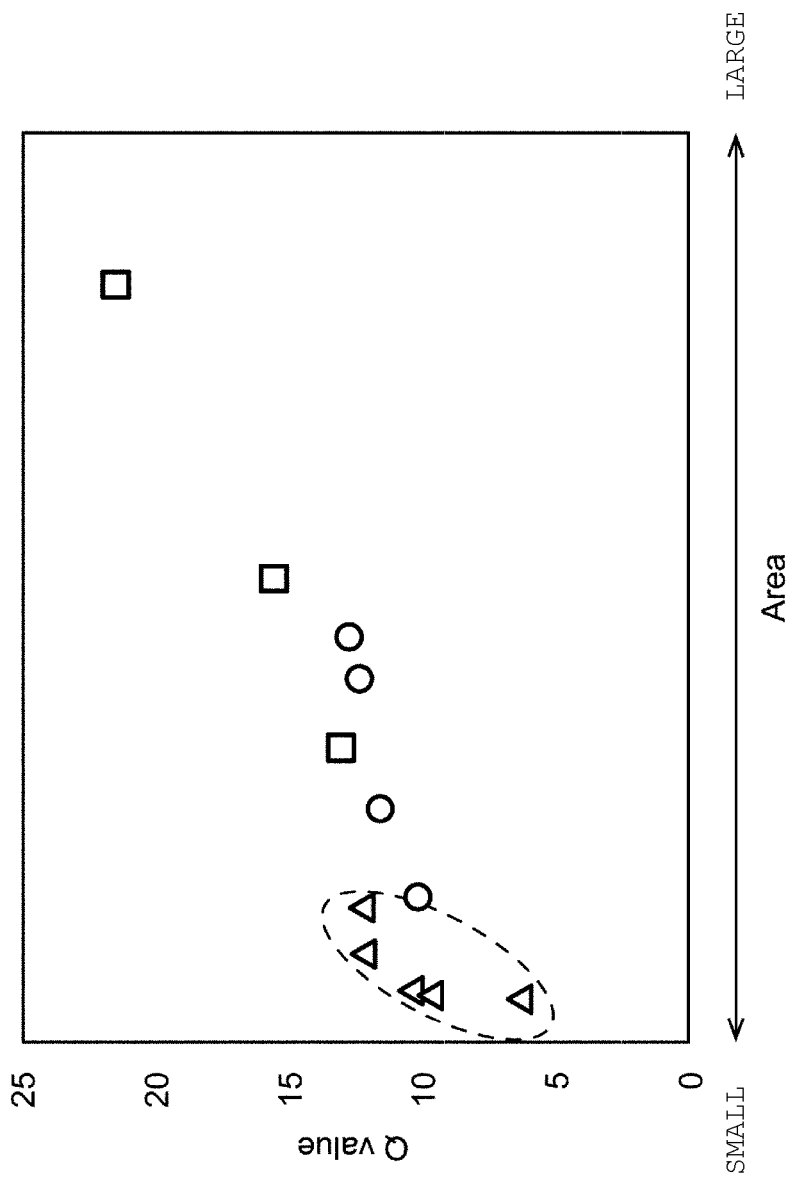
FIG. 5 depicts an example relation between a Q value and an occupation area according to an embodiment.

FIG. 5 is a graph illustrating an example of a relation between the Q value and the occupation area. In FIG. 5, the vertical axis represents the Q value, and the horizontal axis represents the occupation area. FIG. 5 illustrate results of an electromagnetic field simulation. FIG. 5 also illustrates an example of data concerning inductors used for an oscillation circuit of 28 GHz. Triangular data points indicate data for the inductor element 10 according to the first embodiment. Circular data points indicate data for a double-turn differential spiral inductor. Square data points indicate data for a single-turn inductor. In the example illustrated in FIG. 5, five triangular data points are plotted based on simulations performed with different device design parameters, such as different diameters, wiring widths, and the clearances D of coil portions of the inductors. Four circular data points are plotted for different design parameters. Three square data points are plotted for different design parameters.

As illustrated in FIG. 5, as compared with the double-turn differential spiral inductor and the single-turn inductor, the inductor element 10 according to the first embodiment can reduce the occupation area while the Q value is still kept relatively high. The Q value may be, for example, 10 or higher with certain design parameters.

As described above, according to the first embodiment, the inductor portions 11 and 12 are disposed on the wiring layer WL1, and the inductor portion 13 is disposed on the wiring layer WL2 (spaced from the wiring layer WL1 in the stacking direction). The end portion 131 of the inductor portion 13 is electrically connected to the first end 111 of the inductor portion 11, and the end portion 132 of the inductor portion 13 is electrically connected to the first end 121 of the inductor portion 12. The inductor portions 11, 12, and 13 are the single inductor element 10. This configuration enables the inductor element 10 to have reduced occupation area while still achieving a desired Q value.

The occupation area of the inductor element 10 can be decreased so as to reduce the cost of chips incorporating such an element. Moreover, the arrangement is facilitated to reduce turn around time (TAT). Furthermore, interference between the inductor element 10 and other packages or other substrate wiring can be prevented. The reason is that area reduction of the inductor element 10 can also reduce influence from the magnetic field caused by current flowing through the substrate wiring, for example.

The inductor element 10 may be formed in a rectangular shape as viewed from the stacking direction. This makes it possible to, for example, further improve freedom in arranging the inductor element 10 with respect to other components such as a pad for wire bonding in the device.

As an inductor element of an LC oscillation circuit, a differential spiral inductor may be used in some cases. A double-turn differential spiral inductor provides high inductance due to mutual inductance of inner peripheral wiring and outer peripheral wiring. However, this configuration is apt to increase parasitic capacitance between windings in an in-plane direction (i.e., a direction perpendicular to the stacking direction). As the parasitic capacitance increases, the inductance decreases, and the Q value is decreased. Since an area of the windings in the in-plane direction is increased, parasitic capacitance between the windings and the substrate and other wiring on upper and lower layers increases. Consequently, the Q value is decreased. Potential varies between ends of the inductor element. In the double-turn differential spiral inductor, in some cases, the potential difference increases, and the parasitic capacitance increases between the windings where mutual inductance is generated. Such a factor also decreases the Q value. It is noted that the windings where mutual inductance is generated in the in-plane direction are magnetically coupled in accordance with thickness of the windings.

In contrast, in the first embodiment, as illustrated in FIG. 3, part of the inductor portion 11 and part of the inductor portion 13 overlap each other in the stacking direction, and part of the inductor portion 12 and part of the inductor portion 13 overlap each other in the stacking direction. That is, a planar area of the wiring portion is relatively small. Thus, the part of the inductor portion 13 that overlaps the inductor portion 11 has less parasitic capacitance in the stacking direction via the substrate. Since each of the inductor portions 11 to 13 is a planar, one-turn coil, the parasitic capacitance in the in-plane direction is small. The overlapping parts of the inductor portion 11 and the inductor portion 13 are on the region AR1 side of the wiring of the inductor element 10 so that the overlapping parts have a small potential difference and low parasitic capacitance. The same applies to the overlapping parts of the inductor portion 12 and the inductor portion 13 on the region AR2 side. Generally, because a width of wiring is greater than a thickness of the wiring, inductor coupling in the stacking direction is stronger than inductor coupling in the in-plane direction. In such a case, the overlaps in the stacking direction make it possible to obtain higher inductance. In this manner, the inductor element 10 according to the first embodiment has less parasitic capacitance and provides high inductance so that the occupation area can be reduced while the high Q value can be maintained.

While an embodiment in which the inductor portions 11 to 13 are disposed on the two wiring layers WL1 and WL2 has been described, the inductor portions 11 to 13 may be disposed on three or more wiring layers in other embodiments. For example, substantially the same polygonal shaped or annular-shaped inductor portions as the inductor portions 11 and 12 may be disposed with one or more intermediate wiring layers between the wiring layer on which the inductor portions 11 and 12 are disposed and the wiring layer on which the inductor portion 13 is disposed. Inductor portions on the intermediate wiring layer can also be connected to the inductor portions 11 to 13 with vias and form a single inductor element 10. This makes it possible to further improve the inductance. Moreover, the occupation area can be reduced without significantly decreasing the inductance. Depending on positions of the vias, the inductor portion 13 need not necessarily include the parts (e.g., polygonal parts or annular parts) that overlap the inductor portions formed on an adjacent intermediate wiring layer.

First Modification

Figure 6:
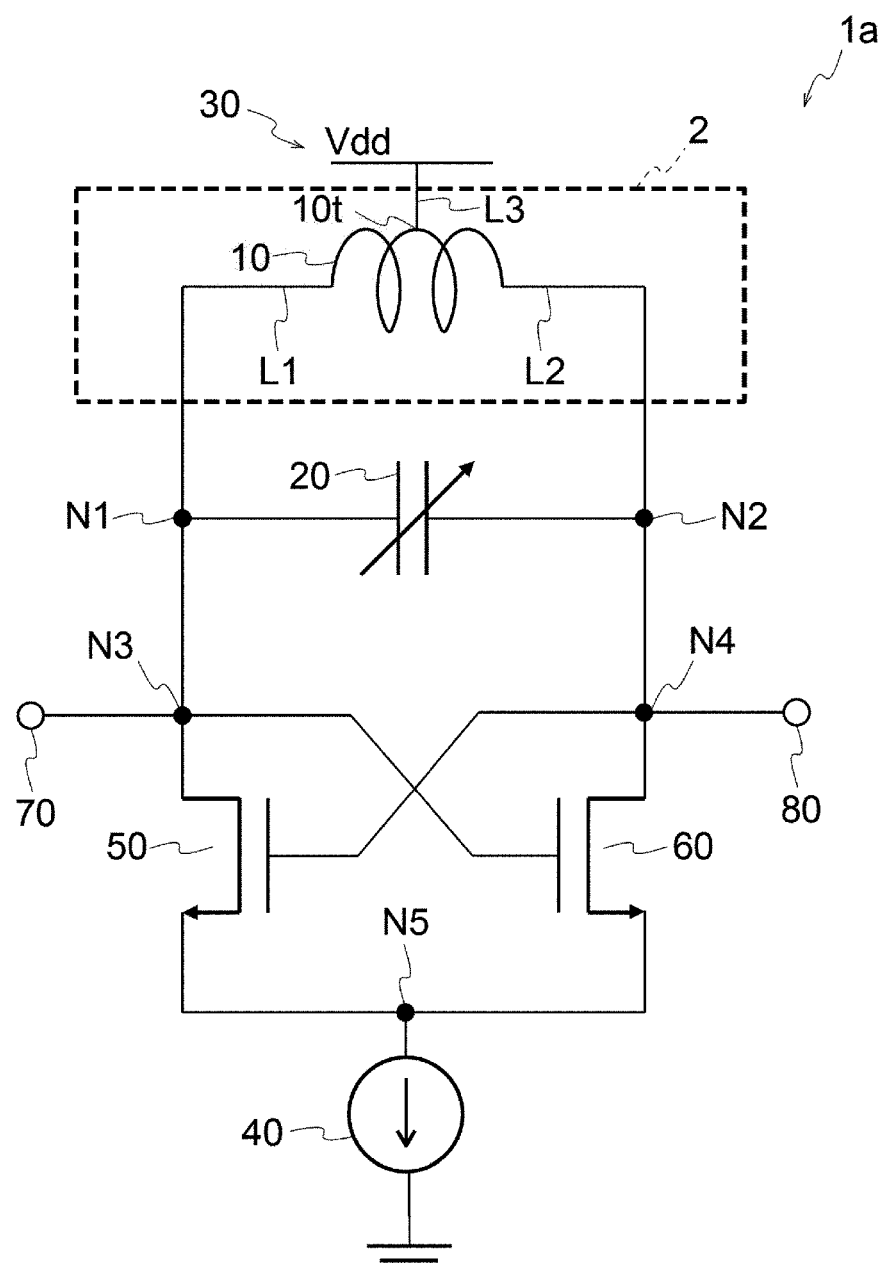
FIG. 6 is a circuit diagram of an oscillation circuit apparatus according to a first modification.

FIG. 6 is a circuit diagram illustrating a configuration of an oscillation circuit apparatus 1a according to a first modification. In the first modification, the current source 40 is provided at a different position from that in the first embodiment.

The end portion 10t is connected to the power source connector 30. The current source 40 is interposed between the node N5 and the ground.

The oscillation circuit apparatus 1a and the semiconductor integrated circuit device 2 according to the first modification provide the same or substantially the same effect as the first embodiment.

Second Modification

Figure 7:
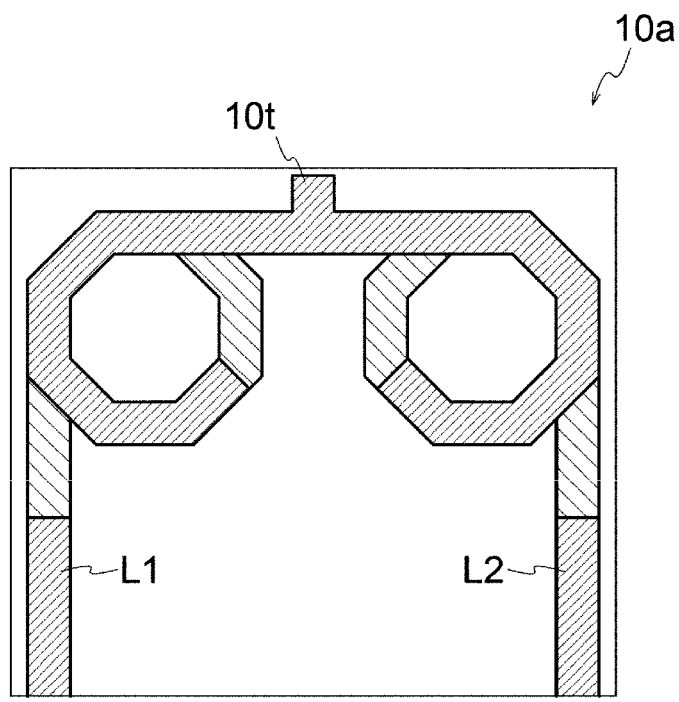
FIG. 7 depicts an inductor element in a plan view according to a second modification.

FIG. 7 is a plan view of an inductor element 10a according to a second modification, illustrating a configuration thereof. In the second modification, the position of connection between the inductor portion 11 and the wiring L1 and L1a, and the position of connection between the inductor portion 12 and the wiring L2 and L2a are different from those in the first embodiment. In general, these connection positions may be freely selected insofar as the selected positions are within a range that properties of the inductor portions 11 and 12 can be maintained. For example, the connection positions may be moved to be anywhere within the range in which the inductor portions 11, 12, and 13 overlap one another as viewed from the stacking direction.

An oscillation circuit apparatus 1b and the semiconductor integrated circuit device 2 according to the second modification provide the same or substantially the same effect as the first embodiment.

Second Embodiment

Figure 8:
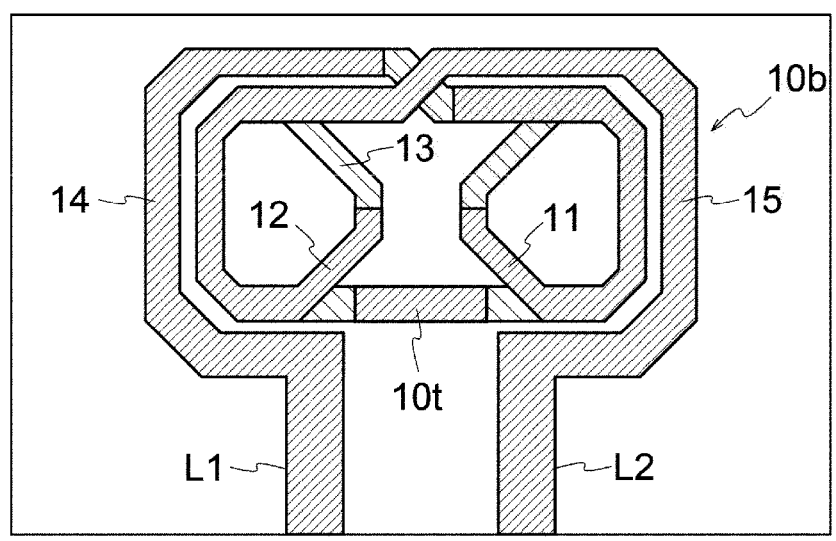
FIG. 8 depicts an inductor element in a plan view according to a second embodiment.

FIG. 8 is a plan view of an inductor element 10b according to a second embodiment, illustrating a configuration thereof. In the second embodiment, inductor portions 14 and 15 are positioned around outer peripheries of the inductor portions 11, 12, and 13. In FIG. 8, note that the inductor portions 11, 12, and 13 are inverted in position as compared to those illustrated in FIGS. 2 to 4B. In other words, in FIG. 8, the positioning of the inductor portions 11, 12, and 13 in FIG. 8 has been rotated by 180 degrees from those depicted in FIGS. 2 to 4B such that inductor element 10b is rotated by 180 degrees as compared to inductor element 10. However, the inductor portions 11, 12, and 13 illustrated in FIG. 8 and the inductor portions 11, 12, and 13 illustrated in FIGS. 2 to 4B are in point symmetry with respect to the center of the inductor element 10b. Thus, as depicted in FIG. 8, the inductor portion 11 is disposed in the region AR2, and the inductor portion 12 is disposed in the region AR1. Similarly, in FIG. 8, the inductor portion 13 is electrically connected to the inductor portion 11 in the region AR4 and electrically connected to the inductor portion 12 in the region AR3.

While the inductor portions 11, 12, and 13 depicted in FIG. 8 have angular shapes pointing toward the center of the inductor element 10b, the shapes are not limited thereto. The inductor portions 11, 12, and 13 may have more polygonal shapes or annular shapes as described in the first embodiment.

FIGS. 9A and 9B are plan views of the inductor element 10b in FIG. 8 in a divided level state. An inductor portion 13a illustrated in FIG. 9A is disposed at a position on the wiring layer WL1 that corresponds to a position where the end portion 10t illustrated in FIG. 8 is disposed on the wiring layer WL2. The inductor portion 13a on the first wiring layer WL1 is connected to the inductor portion 13 on the second wiring layer WL2 with a via (or vias).

The inductor element 10b further includes the inductor portions 14 and 15, and connection wiring 14a and 15a. The inductor portions 11 to 13, the inductor portions 14 and 15, and the connection wiring 14a and 15a together form the single inductor element 10b.

The inductor portion 14 is adjacent to and surrounding at least part of an outer periphery of the inductor portion 12 on the first wiring layer WL1. In this example, the inductor portion 14 is also adjacent to and surrounding at least part of an outer periphery of the inductor portion 13 on the second wiring layer WL2. More specifically, when viewed from above, the inductor portion 14 is in region AR1 outside of the outermost position of the inductor portion 12 and also outside of the outermost position of the inductor portion 13 in the region AR3. That is, the inductor portion 14 includes portions in both the first wiring layer WL1 and the second wiring layer WL2.

The inductor portion 14 may include a part (e.g., approximately half) having a partially polygonal shape or annular shape or a U-shaped portion. In general, the inductor portion 14 has a shape corresponding to the adjacent inductor portions 12 and 13, but being somewhat larger in relevant dimension than these inductor portions 12 and 13 in view of the positioning of the inductor portion 14 outside of these other portions. The inductor portion 14 has a first end 141, electrically connected to the second end 112 of the inductor portion 11, and a second end 142, electrically connected to the wiring L1.

The inductor portion 14 is magnetically coupled to at least one of the inductor portion 12 and the inductor portion 13 (in the region AR3). That is, the inductor portion 14, the inductor portion 12, and the inductor portion 13 (in the region AR3) each have a current flow in substantially the same direction, and thus increase inductance due to mutual inductance.

The inductor portion 14 includes an inductor portion 16, an inductor portion 17, and a via.

The inductor portion 16 is on the wiring layer WL1 adjacent to the outer periphery of the inductor portion 12. The inductor portion 16 is magnetically coupled to the inductor portion 12 in an in-plane direction of the wiring layer WL1. Thus, inductance of the inductor element 10b can be improved. The inductor portion 16 may be made of, for example, the same or substantially the same material as the inductor portions 11 to 13.

The inductor portion 17 is on the wiring layer WL2 in the region AR3 adjacent to the outer periphery of the inductor portion 13. The inductor portion 17 is magnetically coupled to the part of the inductor portion 13 in the region AR3 in an in-plane direction of the wiring layer WL2. Thus, inductance of the inductor element 10b can be improved. The inductor portion 17 may be made of, for example, the same or substantially the same material as the inductor portions 11 to 13. The inductor portion 17 is connected to the connection wiring 14a. More specifically, in this example, connection wiring 14a is a continuous extension of inductor portion 14a.

The via of inductor portion 14 extends in the stacking direction and electrically connects the inductor portion 16 and the inductor portion 17 to each other. A plurality of vias may be disposed along the inductor portions 16 and 17 at various positions. The plurality of vias may be disposed over a region where the inductor portions 16 and 17 overlap each other. Alternatively, a single via structure may be continuously extend along the inductor portions 16 and 17. Thus, the inductor portion 14 can be increased in thickness in the stacking direction to decrease wiring resistance. As a result, the Q value of the inductor element 10b can be increased. The via(s) of inductor portion 14 may be made of, for example, the same or substantially the same material as the vias V1 and V2.

The inductor portion 15 is adjacent to and surrounding at least part of an outer periphery of the inductor portion 11 on the first wiring layer WL1. In this example, the inductor portion 15 is also adjacent to and surrounding at least part of an outer periphery of the inductor portion 13 on the second wiring layer WL2. More specifically, when viewed from above, the inductor portion 15 is in region AR2 outside of the outermost position of the inductor portion 11 and also outside of the outermost position of the inductor portion 13 in the region AR4. That is, the inductor portion 15 includes portions in both the first wiring layer WL1 and the second wiring layer WL2.

The inductor portion 15 may include a part (e.g., approximately half) having a partially polygonal shape or annular shape or a U-shaped portion. In general, the inductor portion 15 has a shape corresponding to the adjacent inductor portions 11 and 13, but being somewhat larger in relevant dimension than these inductor portions 11 and 13 in view of the positioning of the inductor portion 15 outside of these other portions. The inductor portion 15 has a first end 151, electrically connected to the second end 122 of the inductor portion 12 and a second end 152, electrically connected to the wiring L2.

The inductor portion 15 is magnetically coupled to at least one of the inductor portion 11 and the inductor portion 13 (in the region AR4). That is, the inductor portion 15, the inductor portion 11, and the inductor portion 13 (in the region AR4) each have a current flow in substantially the same direction and thus increase inductance due to mutual inductance.

The inductor portion 15 includes an inductor portion 18, an inductor portion 19, and a via.

The inductor portion 18 is on the wiring layer WL1 adjacent to the outer periphery of the inductor portion 11. The inductor portion 18 is magnetically coupled to the inductor portion 11 in the in-plane direction of the wiring layer WL1. Thus, inductance of the inductor element 10b can be improved. The inductor portion 18 may be made of, for example, the same or substantially the same material as the inductor portions 11 to 13. The inductor portion 18 is connected to the connection wiring 15a.

The inductor portion 19 is on the wiring layer WL2 in the region AR4 adjacent to the outer periphery of the inductor portion 13. The inductor portion 19 is magnetically coupled to part of the inductor portion 13 in the region AR4 in the in-plane direction of the wiring layer WL2. Thus, inductance of the inductor element 10b can be improved. The inductor portion 19 may be made of, for example, the same or substantially the same material as the inductor portions 11 to 13.

The via of the inductor portion 15 extends in the stacking direction and electrically connects the inductor portion 18 and the inductor portion 19 to each other. A plurality of vias may be disposed along the inductor portions 18 and 19 at various positions. The plurality of vias may be disposed over a region where the inductor portions 18 and 19 overlap each other. Alternatively, a single via structure may continuously extend along the inductor portions 18 and 19. Thus, the inductor portion 15 can be increased in thickness in the stacking direction to decrease wiring resistance. As a result, the Q value can be increased. The via(s) of inductor portion 15 may be made of, for example, the same or substantially the same material as the via V1.

The connection wiring 14a electrically connects the first end 141 of the inductor portion 14 (more specifically, inductor portion 17 of the inductor portion 14) and the second end 112 of the inductor portion 11 to each other. In the example illustrated in FIG. 9B, the connection wiring 14a is disposed on the wiring layer WL2. The connection wiring 14a has an end portion 143 connected to the second end 112 of the inductor portion 11 by a via. The connection wiring 14a is continuous from the inductor portion 14. That is, the connection wiring 14a extends from the inductor portion 14 (more specifically, the inductor portion 17 of the inductor portion 14).

The connection wiring 15a electrically connects the first end 151 of the inductor portion 15 and the second end 122 of the inductor portion 12 to each other (more specifically, connection wiring 15a extends from the inductor portion 18 on the wiring layer WL1). In the example illustrated in FIG. 9A, the connection wiring 15a is disposed on the wiring layer WL1. The connection wiring 15a is continuous between the inductor portion 12 and the inductor portion 18 without using a via.

The connection wiring 14a and the connection wiring 15a are disposed on the different wiring layers WL1 and WL2 and cross each other when viewed from the stacking direction. However, since the connection wiring 14a and the connection wiring 15a cross each other at two different levels they avoid making an electrical connection therebetween.

The end of the inductor element 10b that is connected to the wiring L1 corresponds to the second end 142 of the inductor portion 14. The other end of the inductor element 10b that is connected to the wiring L2 corresponds to the second end 152 of the inductor portion 15.

The rest of the configuration of the oscillation circuit apparatus 1 and the semiconductor integrated circuit device 2 according to the second embodiment is the same or substantially the same as the corresponding configuration of the oscillation circuit apparatus 1 and the semiconductor integrated circuit device 2 according to the first embodiment.

Utilizing the inductor portions 14 and 15, the inductor element 10b according to the second embodiment can provide higher inductance than the inductor element 10 according to the first embodiment.

In a frequency band of 14 GHz, for example, there is a need to make inductance higher than in a frequency band of, for example, 28 GHz indicated in the first embodiment. The reason is that an LC resonance frequency f is expressed below in Formula (1) wherein L represents an inductance of the inductor element 10b, and C represents a capacitance of the capacitor 20.

Formula (1):

$$f = \frac{1}{2\pi\sqrt{LC}} \quad (1)$$

The inductor element 10b according to the second embodiment increases the inductance and may be used in a frequency band less than a submillimeter wave band.

FIG. 10 is a graph illustrating an example of a relation between a Q value and an occupation area (device area occupied). In FIG. 10, the vertical axis represents the Q value, and the horizontal axis represents the occupation area.

FIG. 10 illustrates a result of an electromagnetic field simulation. FIG. 10 illustrates an example of data concerning inductors used for an oscillation circuit of 14 GHz. A triangular data point indicates data of the inductor element 10b according to the second embodiment. Circular data points indicate data of a differential spiral inductor.

As illustrated in FIG. 10, in comparison with the differential spiral inductor, the inductor element 10b according to the second embodiment reduces the occupation area while the Q value is maintained. The Q value may be, for example, 10 or higher.

The oscillation circuit apparatus 1 and the semiconductor integrated circuit device 2 according to the second embodiment provides the same or substantially the same effect as the first embodiment.

As illustrated in FIG. 8, a curvature of the inductor portion 11 on a side closer to the inductor portion 12 is greater than a curvature of the inductor portion 11 on a side away from the inductor portion 12. In this context, "curvature" refers to an angular transition between one direction (e.g., a generally horizontal in-plane direction) and another direction (e.g., a generally vertical in-plane direction). Thus, for example, as depicted in FIG. 8, the inward portion of inductor portion 12 transitions at a more acute (steeper) angle than the outward portion(s) of the inductor portion 12. Similarly, a curvature of the inductor portion 12 on a side closer to the inductor portion 11 is greater than a curvature of the inductor portion 12 on a side away from the inductor portion 11. Parts of the inductor portions 11 and 12 that are opposed to each other are angular. This weakens magnetic coupling between the inductor portion 11 and the inductor portion 12. As a result, without increasing the clearance D between the inductor portion 11 and the inductor portion 12, the inductance can be prevented from decreasing. This configuration enables the inductor element 10b according to the second embodiment to reduce the occupation area while maintaining the Q value. Such a change in curvature of facing portions of the inductor portion 11 and inductor portion 12 may also be applied to the first embodiment.

The same similarly applies to a curvature of the inductor portion 13. In the region AR4, a curvature of the inductor portion 13 on a side closer to the inductor portion 17 is greater than a curvature of the inductor portion 13 on a side away from the inductor portion 17. In the region AR3, a curvature of the inductor portion 13 on a side closer to the inductor portion 19 is greater than a curvature of the inductor portion 13 on a side away from the inductor portion 19. Such a change in curvature may be similarly be applied to the first embodiment.

Figure 11:
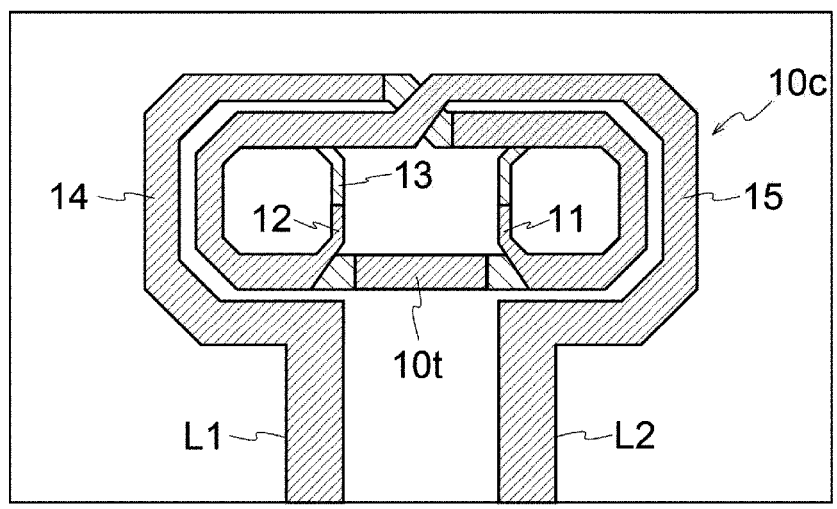
FIG. 11 depicts an inductor element in a plan view according to a modification of the second embodiment.

FIG. 11 is a plan view of an inductor element 10c according to a modification of the second embodiment. Inductance can also be prevented from decreasing by changing a line width of the inductor portions instead of the curvature. That is, in this example, a line width of the inductor portion 11 on a side closer to the inductor portion 12 is less than a line width of the inductor portion 11 on a side away from the inductor portion 12. A line width of the inductor portion 12 on a side closer to the inductor portion 11 is less than a line width of the inductor portion 12 on a side away from the inductor portion 11. However, when the line width is made too small, wiring resistance increases. In view of this, the line width may be set within such a range as to satisfy required performances. Such a change in line width may be applied to the first embodiment. Both curvature change and line width change may be utilized in a device.

The same applies to a line width of the inductor portion 13. In the region AR4, a line width of the inductor portion 13 on a side closer to the inductor portion 17 is less than a line width of the inductor portion 13 on a side away from the inductor portion 17. In the region AR3, a line width of the inductor portion 13 on a side closer to the inductor portion 19 is less than a line width of the inductor portion 13 on a side away from the inductor portion 119. Such a change in line width may also be applied to the first embodiment.

The presence of the vias V1 and V2 as illustrated in FIG. 2 may increase the thickness of the wiring. Therefore, in other examples, the vias V1 and V2 may be offset in position from the location (s) where the inductor portion 11 and the inductor portion 12 are in closest proximity to each other.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

APPENDIX OF ADDITIONAL EXAMPLES

A semiconductor integrated circuit device can comprise the third inductor portion in the third region magnetically coupled to the first inductor portion. The third inductor portion in the fourth region can be magnetically coupled to the second inductor portion.

A semiconductor integrated circuit device can comprise the fourth inductor portion magnetically coupled to at least one of the second inductor portion and the third inductor portion in the fourth region. The fifth inductor portion can be magnetically coupled to at least one of the first inductor portion and the third inductor portion in the third region.

A semiconductor integrated circuit device can include first connection wiring to electrically connect the first end of the fourth inductor portion and the second end of the first inductor portion to each other. Second connection wiring to electrically connect the first end of the fifth inductor portion and the second end of the second inductor portion to each other can be included. In this context, the first connection wiring and the second connection wiring can be disposed on different wiring layers and intersect each other as viewed from the first direction.

A semiconductor integrated circuit device in which, when viewed from the first direction, a curvature of the third inductor portion in the third region on a side closer to the second inductor portion is larger than a curvature of the third inductor portion in the third region on a side away from the second inductor portion. Also, when viewed from the first direction a curvature of the third inductor portion in the fourth region on a side closer to the first inductor portion is larger than a curvature of the third inductor portion in the fourth region on a side away from the first inductor portion.

A semiconductor integrated circuit device can have a line width of the third inductor portion in the third region on a side closer to the second inductor portion be smaller than a line width of the third inductor portion in the third region on a side away from the second inductor portion. Also, a line width of the third inductor portion in the fourth region on a side closer to the first inductor portion can be smaller than a line width of the third inductor portion in the fourth region on a side away from the first inductor portion.

What is claimed is:

1. A semiconductor integrated circuit device, comprising:
    an inductor element including:
        a first inductor portion in a first region on a first wiring layer;
        a second inductor portion in a second region on the first wiring layer, the second region being adjacent to the first region;
        a third inductor portion on a second wiring layer spaced from the first wiring layer in a first direction, the third inductor portion comprising:
            a first end portion electrically connected to a first end of the first inductor portion;
            a second end portion electrically connected to a first end of the second inductor portion; and
            a third end portion between the first and second end portions;
        a fourth inductor portion adjacent an outer peripheral portion of the second inductor portion on the first wiring layer and adjacent an outer peripheral portion of the third inductor portion on the second wiring layer as viewed from the first direction, the fourth inductor portion comprising a first end electrically connected to a second end of the first inductor portion; and
        a fifth inductor portion adjacent an outer peripheral portion of the first inductor portion on the first wiring layer and adjacent an outer peripheral portion of the third inductor portion on the second wiring layer as viewed from the first direction, the fifth inductor portion comprising a first end electrically connected to a second end of the second inductor portion.

2. The semiconductor integrated circuit device according to claim 1, wherein
    the first end portion of the third inductor portion is above the first region in the first direction and overlapping at least part of the first inductor portion when viewed from the first direction, and
    the second end portion of the third inductor portion is above the second region in the first direction and overlapping at least part of the second inductor portion as viewed from the first direction.

3. The semiconductor integrated circuit device according to claim 1, wherein the inductor element further includes:
    a first via extending in the first direction between the first and second wiring layers and electrically connecting the first end portion of the third inductor portion and the first end of the first inductor portion; and
    a second via extending in the first direction between the first and second wiring layers and electrically connecting the second end portion of the third inductor portion and the first end of the second inductor portion.

4. The semiconductor integrated circuit device according to claim 1, wherein
    the fourth inductor portion comprises:
        a sixth inductor portion on the first wiring layer and adjacent at least part of an outer periphery of the second inductor portion,
        a seventh inductor portion on the second wiring layer adjacent at least part of an outer periphery of the third inductor portion, and
        an electrical connection between the sixth inductor portion and the seventh inductor portion; and the fifth inductor portion comprises:
an eighth inductor portion on the first wiring layer adjacent at least part of an outer periphery of the first inductor portion,
a ninth inductor portion on the second wiring layer and adjacent at least part of an outer periphery of the third inductor portion, and
an electrical connection between the eighth inductor portion and the ninth inductor portion.

5. The semiconductor integrated circuit device according to claim 1, wherein
the first inductor portion and the second inductor portion are symmetric about a centerline between the first inductor portion and the second inductor portion as viewed from the first direction, and
the third inductor portion is symmetrical about the centerline as viewed from the first direction.

6. The semiconductor integrated circuit device according to claim 5, wherein the third end portion of the third inductor portion is on the centerline.

7. The semiconductor integrated circuit device according to claim 1, wherein
a curvature of the first inductor portion on a side facing the second inductor portion is greater than a curvature of the first inductor portion on a side facing away from the second inductor portion, and
a curvature of the second inductor portion on a side facing the first inductor portion is greater than a curvature of the second inductor portion on a side facing away from the first inductor portion.

8. The semiconductor integrated circuit device according to claim 1, wherein
a line width of the first inductor portion in a portion closest to the second inductor portion is less than a line width of the first inductor portion in a portion farthest away from the second inductor portion, and
a line width of the second inductor portion in a portion closest to the first inductor portion is less than a line width of the second inductor portion in a portion farthest away from the first inductor portion.

9. An oscillation circuit apparatus, comprising:
a semiconductor integrated circuit device according to claim 1;
a power supply terminal connected to the third end portion of the third inductor portion of the semiconductor integrated circuit device; and
a capacitor comprising:
a first end electrically connected to a first end of the inductor element of the semiconductor integrated circuit device; and
a second end electrically connected to a second end of the inductor element of the semiconductor integrated circuit device.

10. The oscillation circuit apparatus according to claim 9, wherein
the first end portion of the third inductor portion is above the first region in the first direction and overlapping at least part of the first inductor portion when viewed from the first direction, and
the second end portion of the third inductor portion is above the second region in the first direction and overlapping at least part of the second inductor portion as viewed from the first direction.

11. The oscillation circuit apparatus according to claim 9, wherein the inductor element further includes:
a first via extending in the first direction between the first and second wiring layers and electrically connecting the first end portion of the third inductor portion and the first end of the first inductor portion; and
a second via extending in the first direction between the first and second wiring layers and electrically connecting the second end portion of the third inductor portion and the first end of the second inductor portion.

12. The oscillation circuit apparatus according to claim 9, wherein
the fourth inductor portion of the semiconductor integrated circuit device comprises:
a sixth inductor portion on the first wiring layer and adjacent at least part of an outer periphery of the second inductor portion,
a seventh inductor portion on the second wiring layer adjacent at least part of an outer periphery of the third inductor portion, and
an electrical connection between the sixth inductor portion and the seventh inductor portion; and
the fifth inductor portion of the semiconductor integrated circuit device comprises:
an eighth inductor portion on the first wiring layer adjacent at least part of an outer periphery of the first inductor portion,
a ninth inductor portion on the second wiring layer and adjacent at least part of an outer periphery of the third inductor portion, and
an electrical connection between the eighth inductor portion and the ninth inductor portion.

13. The oscillation circuit apparatus according to claim 9, wherein
the first inductor portion and the second inductor portion are symmetric about a centerline between the first inductor portion and the second inductor portion as viewed from the first direction, and
the third inductor portion is symmetrical about the centerline as viewed from the first direction.

14. The oscillation circuit apparatus according to claim 13, wherein the third end portion of the third inductor portion is disposed on the centerline.

15. The oscillation circuit apparatus according to claim 9, wherein
a curvature of the first inductor portion on a side facing the second inductor portion is greater than a curvature of the first inductor portion on a side facing away from the second inductor portion, and
a curvature of the second inductor portion on a side facing the first inductor portion is greater than a curvature of the second inductor portion on a side facing away from the first inductor portion.

16. The oscillation circuit apparatus according to claim 9, wherein
a line width of the first inductor portion in a portion closest to the second inductor portion is less than a line width of the first inductor portion in a portion farthest away from the second inductor portion, and
a line width of the second inductor portion in a portion closest to the first inductor portion is less than a line width of the second inductor portion in a portion farthest away from the first inductor portion.

17. A semiconductor integrated circuit device, comprising:
an inductor element including:
a first inductor portion in a first region on a first wiring layer;
a second inductor portion in a second region on the first wiring layer, the second region being different from the first region;

a third inductor portion on a second wiring layer spaced from the first wiring layer in a first direction, the third inductor portion including:
   a first end portion electrically connected to a first end of the first inductor portion; and
   a second end portion electrically connected to a first end of the second inductor portion;
a fourth inductor portion adjacent an outer peripheral portion of the second inductor portion on the first wiring layer and adjacent an outer peripheral portion of the third inductor portion on the second wiring layer as viewed from the first direction, the fourth inductor portion comprising a first end electrically connected to a second end of the first inductor portion; and
a fifth inductor portion adjacent an outer peripheral portion of the first inductor portion on the first wiring layer and adjacent an outer peripheral portion of the third inductor portion on the second wiring layer as viewed from the first direction, the fifth inductor portion comprising a first end electrically connected to a second end of the second inductor portion.

18. The semiconductor integrated circuit device according to claim 17, wherein
a portion of the third inductor portion is magnetically coupled to the first inductor portion, and
another portion of the third inductor portion is magnetically coupled to the second inductor portion.

19. A semiconductor integrated circuit device, comprising:
an inductor element including:
   a first inductor portion in a first region on a first wiring layer;
   a second inductor portion in a second region on the first wiring layer, the second region being different from the first region; and
   a third inductor portion on a second wiring layer spaced from the first wiring layer in a first direction, the third inductor portion including:
     a first end portion electrically connected to a first end of the first inductor portion; and
     a second end portion electrically connected to a first end of the second inductor portion, wherein
a curvature of the first inductor portion on a side facing the second inductor portion is greater than a curvature of the first inductor portion on a side facing away from the second inductor portion, and
a curvature of the second inductor portion on a side facing the first inductor portion is greater than a curvature of the second inductor portion on a side facing away from the first inductor portion.

20. An oscillation circuit apparatus, comprising:
a semiconductor integrated device circuit device according to claim 19;
a power supply terminal connected to a part of the third inductor portion of the semiconductor integrated device circuit device; and
a capacitor comprising:
   a first end electrically connected to a first end of the inductor element of the semiconductor integrated circuit device; and
   a second end electrically connected to a second end of the inductor element of the semiconductor integrated circuit device.

\* \* \* \* \*